United States Patent [19]

Baggio et al.

[11] Patent Number: 5,077,176
[45] Date of Patent: Dec. 31, 1991

[54] PRE-PLATE CLEANING PROCESS

[75] Inventors: Thomas J. Baggio, Westmont; Raymond C. Hladovcak, Seneca; Robert W. Landorf, Arlington Hieghts, all of Ill.

[73] Assignee: AT&T Bell Laboratories, Murray Hill, N.J.

[21] Appl. No.: 559,875

[22] Filed: Jul. 30, 1990

[51] Int. Cl.⁵ .............................................. G03C 5/00
[52] U.S. Cl. .................................... 430/313; 430/318; 430/325; 430/331; 134/2; 134/38; 134/40; 134/42
[58] Field of Search ............... 430/313, 318, 325, 331; 134/2, 38, 40, 42

[56] References Cited

U.S. PATENT DOCUMENTS

| | | | |
|---|---|---|---|
| 3,868,272 | 2/1975 | Tardoskegyi | 134/26 |
| 4,576,685 | 3/1986 | Goffredo et al. | 204/30 |
| 4,576,743 | 3/1986 | Kita et al. | 134/40 |
| 4,718,972 | 1/1988 | Baku et al. | 134/2 |
| 4,894,095 | 1/1990 | Schramm et al. | 134/40 |

Primary Examiner—Hoa Van Le
Attorney, Agent, or Firm—Les Birnbaum

[57] ABSTRACT

Disclosed is a cleaning process for use primarily in the fabrication of printed circuit boards. Cleaning is done in-line with the coating and development of a photoresist layer. The process includes a spray cleaning and micro-etch, followed by the application of an anti-tarnish so that the boards can be stored prior to plating.

12 Claims, 3 Drawing Sheets

PRE-PLATE CLEANING PROCESS

Background of the Invention

This invention relates to a cleaning process useful in the fabrication of printed circuit boards.

In the fabrication of printed circuit boards, a key operation is the definition of the copper conductors on the board. The prior art methods usually involve application and development of a photoresist over a thin, uniform copper layer in order to expose selected areas to be plated. At a subsequent stage, just prior to plating, the exposed copper areas are cleaned by batch soaking to remove residues and adhesion promoters. This batch soaking usually involves an initial clean, followed by a micro-etch and a final clean, all separated by rinsing operations. While such a technique is adequate, difficulties have been encountered in getting fine line patterns (conductor widths of less than 1,524 mm (0.006 in)). Further, the soaking tanks tend to take up a great deal of space, and the processing time for soak cleaning tends to be fairly long. Finally, "dragout", where solutions are transferred from tank to tank and station to station, is an inherent shortcoming of batch processing.

Spray cleaning has been proposed previously for removal of solder flux from completed circuit boards (see, e.g., U.S. Pat. No. 3,868,272 issued to Tardoskegyi). Etching, rinsing and anti-tarnish application by means of sprays has also been suggested as part of an electroless plating operation (see U.S. Pat. No. 4,576,685 issued to Goffredo et al).

It is an object of the invention to provide a cleaning method prior to electroplating a metal which results in fine line conductors.

SUMMARY OF THE INVENTION

This and other objects are achieved in accordance with the invention which is a method for fabricating workpieces moving along an assembly line including depositing a photoresist layer over the workpiece and developing the photoresist to expose portions of an underlying metal. Immediately subsequent to, and in-line with, the developing step, the workpieces are successively sprayed with a cleaner, an etching solution, and an anti-tarnish solution.

BRIEF DESCRIPTION OF THE DRAWINGS

These and other features are delineated in detail in the following description. In the drawing.

It will be appreciated that, for purposes of illustration, these figures are not necessarily drawn to scale.

DETAILED DESCRIPTION

Figure 1:
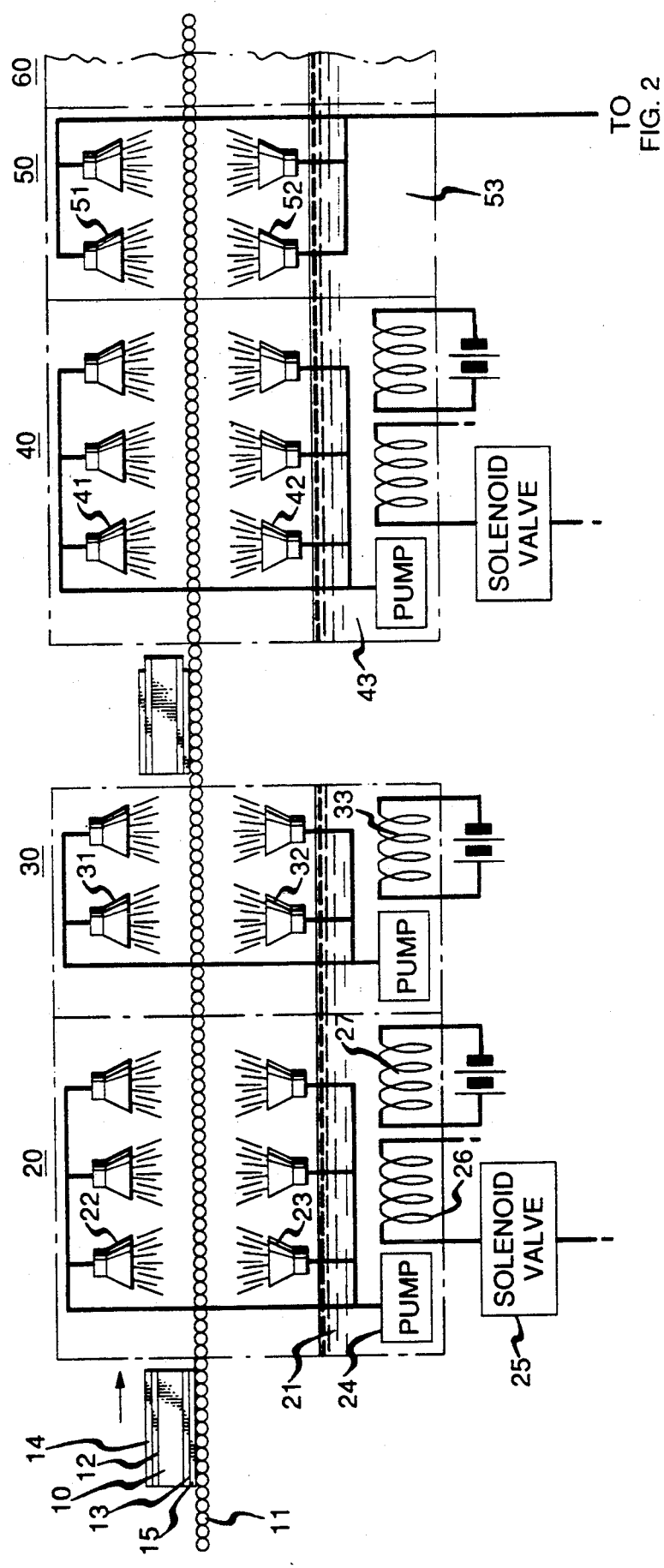
FIGS. 1 and 2 are highly schematic front views of an apparatus useful for carrying out the invention in accordance with one embodiment.
Figure 2:
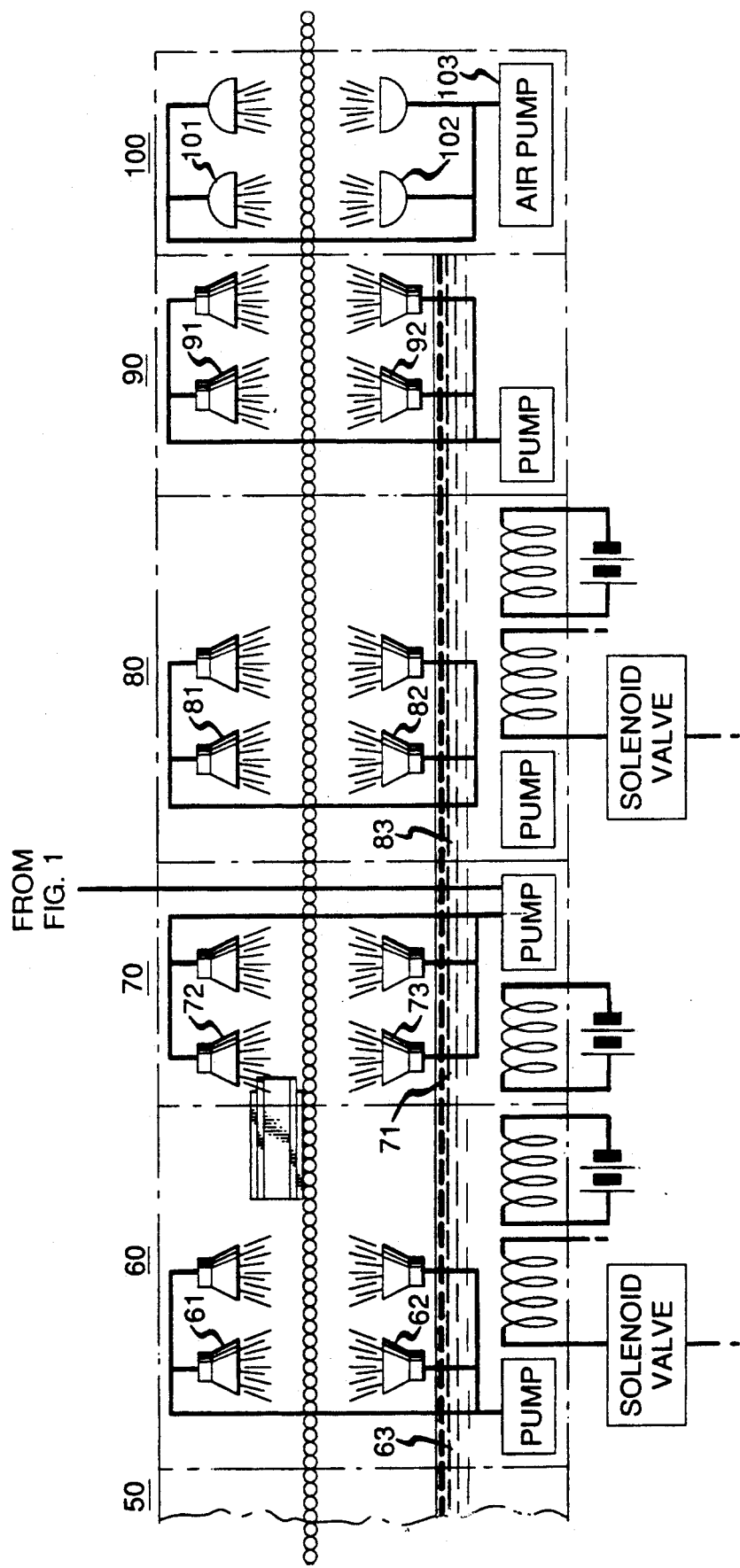
Figure 3:
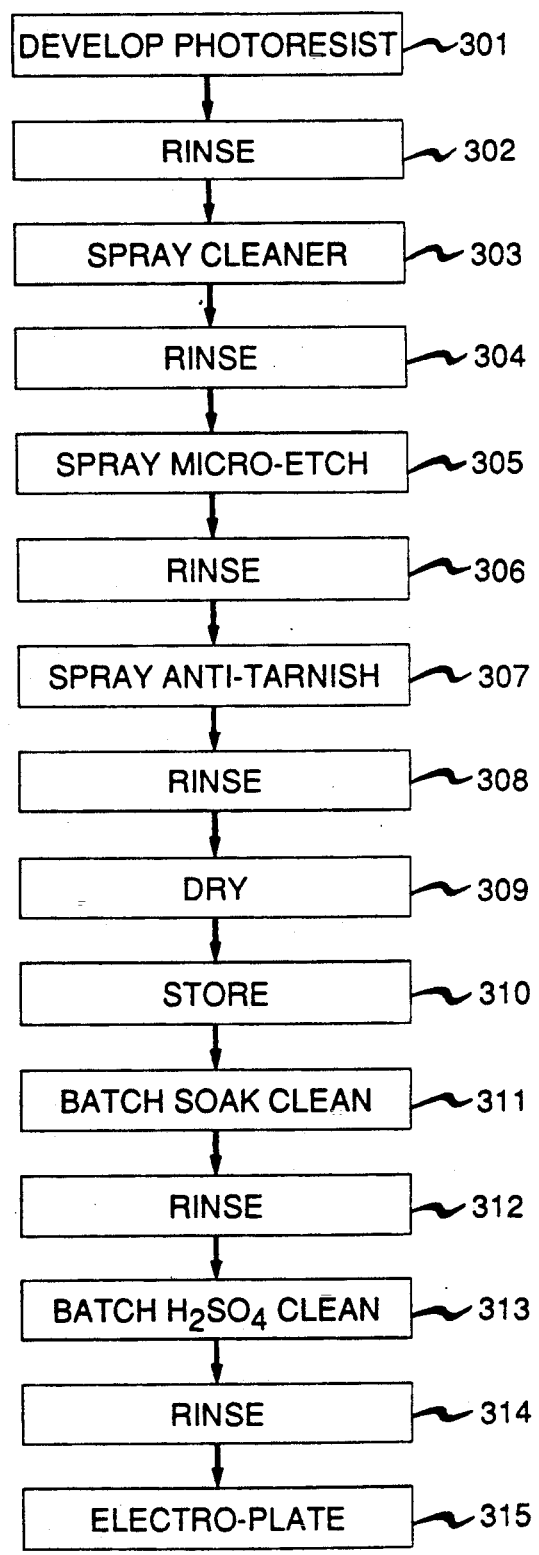
FIG. 3 is a flow diagram illustrating the method of the invention in accordance with the same embodiment.

The apparatus of FIGS. 1 and 2 and the flow diagram of FIG. 3 are presented to illustrate an embodiment of the invention. Workpieces, 10, which in this example were printed circuit boards, were transferred down the manufacturing line on a conveyor comprising a series of rollers, 11. Each circuit board included thin layers, 12 and 13, of metal, typically copper, over essentially the entire top and bottom major surfaces of the board. Also deposited on essentially the entire surface of the metal were layers, 14 and 15, of photoresist. The photoresist is, typically, deposited by hot roll lamination to a thickness of approximately 0.381 mm (0.0015 in). The photoresist had been exposed to ultraviolet light through a mask in accordance with standard photolithographic techniques at the time the workpieces entered the apparatus illustrated FIG. 1.

In the development chamber, 20, the photoresist was selectively etched according to step 301 of FIG. 3 so as to expose portions of the underlying metal in accordance with the pattern defined by the exposure mask in the previous step. For example, an aqueous developing solution, 21, comprising sodium carbonate was applied by spray nozzles, e.g., 22 and 23, coupled to a pump, 24, for approximately 0.6 minutes to etch the areas of photoresist which were not exposed to the ultraviolet light. The temperature of the solution can be raised by a standard heater element, 27, and lowered by pumping cooling water through a solenoid valve 25 and through a coil 26 located in the solution. In the next step, 302, the workpiece entered chamber, 30, where the developing solution was rinsed off by applying water through spray nozzles such as 31 and 32.

After passing through a short (1 m) inspection area, and immediately following the development and rinse step, the workpieces were conveyed to a cleaning chamber, 40, which was in-line with the developing and rinsing chambers, 20 and 30. The cleaning chamber included a series of spray nozzles, e.g., 41 and 42, for spraying a cleaning solution onto the workpieces to clean the surface in accordance with step 303. The cleaning solution, 43, was typically a mixture of $H_2SO_4$ and ammonium chloride sold by Enthone under the designation AD-488, but other standard solutions can be employed. The sprays preferably provide an impingement force of at least 440 newtons to each board surface to ensure removal of residues, adhesion promoters and impurities from the surface of the boards and from any holes through the boards. Each workpiece will typically take approximately 0.6 minutes to pass through the cleaning chamber, although a range of 0.5 to 1 minute is preferred. The workpieces then entered a rinsing chamber, 50, in accordance with step 304 where water, 53, was sprayed onto the workpieces through nozzles such as 51 and 52 to rinse off the cleaning solution. This operation typically took approximately 0.14 minutes.

Next, according to step 305, the workpieces entered chamber 60 (FIG. 2) where nozzles, e.g., 61 and 62, supplied an etching solution, 63, to the surfaces of the workpieces. This step was designed to etch the surfaces of the metal underneath any remaining residues and adhesion promoters to more fully remove them. The etching solution in this example was buffered persulfate, but other solutions which are capable of etching the metal (in this example, copper) can be utilized. The nozzles, 61 and 62, provided an impingement force of at least 330 newtons to ensure adequate removal. The time for the micro-etching step was typically 0.19 minutes, although a range of 10-20 seconds is generally preferred. Following the micro-etch, the workpieces were again rinsed, in step 306, by spraying water, 71, thereon in chamber 70 by means of nozzles, e.g., 72 and 73. This step typically took approximately 0.14 minutes.

In the next chamber, 80, the workpieces were sprayed by means of nozzles, e.g., 81 and 82, with an anti-tarnish solution, 83, according to step 307. The anti-tarnish solution, which in this example was benzotriazole, forms a thin layer of organometallic salts on the exposed metal portions of the copper layer. The former layer serves to protect the copper from oxidation while being stored for the subsequent electroplating operation. The deposited layer is desirably at least 10 angstroms. To this end, each workpiece was sprayed for approximately 0.19 minutes although a range of 10-20 seconds is preferred. This step was followed by a final rinse step, 308, where water was sprayed onto the workpiece in chamber 90 by nozzles such as 91 and 92. This rinse was carried out for approximately 0.14 minutes.

In the final step, 309, carried out by the apparatus of FIGS. 1 and 2, the workpieces were dried in chamber 100 by directing hot air from nozzles, e.g., 101 and 102, to the surface by means of an air pump 103. After a time of approximately 0.45 minutes, the workpieces were unloaded from the apparatus.

At this point, according to step 310, the workpieces can be stored for up to approximately two weeks, if desired, due to the presence of the anti-tarnish layer on the exposed copper. Generally, the workpieces are stored for 0.5 to 7 hours before proceeding.

Whenever it is decided to electroplate onto the exposed metal layers, the workpieces can be subjected to the steps 311-314. First, in accordance with step 311, the workpieces were batch soaked in a cleaning solution such as a mixture of ammonium chloride and formic acid which is sold by Enthone under the designation PC-455 to remove the anti-tarnish layer. Since this layer is fairly thin, the soak can be conducted for only 1 to 1.5 minutes, as opposed to the standard batch soak clean prior to plating which was carried on for at least 5 minutes. This was followed by a water rinse in step 312, which was also accomplished by batch soaking of the workpieces.

In step 313, the workpieces were again batch soaked, but this time is an $H_2SO_4$ cleaning solution. This cleaning step is designed to remove any copper complexes remaining on the exposed metal, and is usually carried on for 60 seconds to 1.5 minutes. This was followed by another rinse in step 314, which was essentially identical to the rinsing of step 312. The workpieces can then be electroplated in the areas of exposed metal in step 315 in accordance with standard techniques.

Several advantages accrue from the above-described process. Conductor widths of less than 1.5 mm can be formed routinely and reproducibly. This is due, in part, to the fact that the boards are treated by the pre-plate cleaning process immediately after and in-line with the development of the photoresist, as opposed to the standard prior-art technique of holding the workpieces after photoresist development in a buffer and cleaning only just prior to the plating process. In general, the longer the boards are held in a buffer prior to cleaning, the more difficult it is to remove residues, adhesion promoters and impurities from the metal surface and from holes in the board. Further, use of sprays rather than soaking allows an increase in impingement force and liquid volume flow so that finer lines and smaller holes can be cleaned and etched.

A second advantage is that processing time can be decreased since spray cleaning and etching can be done quickly due to increased flow of liquid. Even when batch soaking is employed, as in steps 311-314, the time within the soak tank (as in step 311) is considerably reduced.

Various modifications of the invention will become apparent to those skilled in the art. For example, although treatment of both sides of a printed circuit board is illustrated in FIGS. 1 and 2, a single surface of each board can be processed if desired. Further, impingement forces to a surface within the range 200-500 newtons appear to be generally preferred. All such variations which basically rely on the teachings through which the invention has advanced the art are properly considered within the scope of the invention.

We claim:

1. A method of fabricating workpieces moving along an assembly line comprising the steps of:
   depositing a photoresist layer over a major surface of the workpieces and developing the photoresist to expose portions of an underlying metal; and
   immediately subsequent to and in-line with the developing step, successively spraying the workpieces with a cleaning solution and an etching solution to clean the exposed metal, and with an anti-tarnish solution to form an anti-tarnish layer on the exposed metal.

2. The method according to claim 1 further comprising, subsequent to spraying the anti-tarnish solution, storing said workpieces for a period of time.

3. The method according to claim 2 further comprising, subsequent to said storage, removing the anti-tarnish layer and electroplating additional metal on the underlying metal exposed by the photoresist layer.

4. The method according to claim 3 further comprising, subsequent to said storage and prior to said electroplating, removing the anti-tarnish solution by soaking the workpieces.

5. The method according to claim 3 wherein the width of the electroplated metal is less than 1.5 mm.

6. The method according to claim 1 wherein the metal is copper.

7. The method according to claim 1 wherein the cleaning solution comprises a mixture of sulfuric acid and ammonium chloride, the etching solution comprises buffered persulfate and the anti-tarnish solution comprises benzotriazole.

8. The method according to claim 1 wherein the impingement force of the sprays is within the range 200-500 newtons.

9. The method according to claim 1 wherein the anti-tarnish layer comprises organometallic salts.

10. The method according to claim 9 wherein the anti-tarnish layer is subsequently removed by soaking the workpiece in a solution for a period of 1-1.5 minutes.

11. The method according to claim 1 wherein the workpieces are sprayed with the cleaning solution for a period within the range 0.5-1 minutes, with the etching solution for a period within the range 10-20 seconds, and with the anti-tarnish solution for a period within the range 10-20 seconds.

12. The method according to claim 1 wherein the workpieces are printed circuit boards.

* * * * *